United States Patent
Hansen et al.

[11] Patent Number: 6,116,416
[45] Date of Patent: Sep. 12, 2000

[54] MAGNETIC HARD DISK TRANSPORTATION SYSTEM AND METHOD

[76] Inventors: Paul Hansen, 5975 Foligno Way, San Jose, Calif. 95138; Jeff Cross, 1610 Day Valley Rd., Aptos, Calif. 95003; Joseph Zappel, 22253 N. De Anza Cir., Cupertino, Calif. 95014

[21] Appl. No.: 09/417,252

[22] Filed: Oct. 12, 1999

Related U.S. Application Data

[60] Provisional application No. 60/103,836, Oct. 9, 1998.

[51] Int. Cl.[7] .................................................. B65D 85/57
[52] U.S. Cl. ...................... 206/308.3; 206/303; 206/710
[58] Field of Search ................................ 206/303, 308.1, 206/308.3, 389, 391, 394, 407, 414, 509, 511, 701, 710, 711, 712; 211/41.12

[56] References Cited

U.S. PATENT DOCUMENTS

| | | | |
|---|---|---|---|
| 4,516,678 | 5/1985 | Fotiadis et al. | 206/308.3 |
| 4,577,756 | 3/1986 | Hennessy et al. | 206/308.3 |
| 4,700,839 | 10/1987 | Fujii | 206/308.3 |
| 5,284,246 | 2/1994 | Chamberlin et al. | 206/394 |
| 5,346,065 | 9/1994 | Dunbar et al. | 206/308.3 |
| 5,409,114 | 4/1995 | Myers et al. | 206/394 |

*Primary Examiner*—Paul T. Sewell
*Assistant Examiner*—Luan K. Bui
*Attorney, Agent, or Firm*—Allston L. Jones

[57] ABSTRACT

The present invention provides a supporting spindle and shipping system for shipping hard magnetic disks from the point of manufacture to the final assembly point where those disks are incorporated into a hard disk drive for computer use. The spindle is designed to be outwardly expanding to capture and hold the hard disks only by the central hole of each disks such that no disk comes into contact with any other disk. The loaded spindle is then inserted into a shipping tube that has end openings and an interior region where the smallest dimension is considerably larger than the diameter of the disks to be housed within the shipping tube. The spindle is supported within the closed shipping tube by the end caps of the shipping tube so that none of the disks on the spindle come into contact with the interior of the shipping tube. The shipping tube can also be formed to have an exterior shape that facilitates stacking of the shipping tubes. The shipping tube and the end pieces are each made of the same material to minimize the possibility of the creation of contamination within the shipping tube during closure and shipment of the loaded tube. Additionally, an air tight fitting can be proved in one of the end caps to permit the evacuation of the air within the closed shipping tube, and also charging the shipping tube with an inert gas if desired.

29 Claims, 14 Drawing Sheets

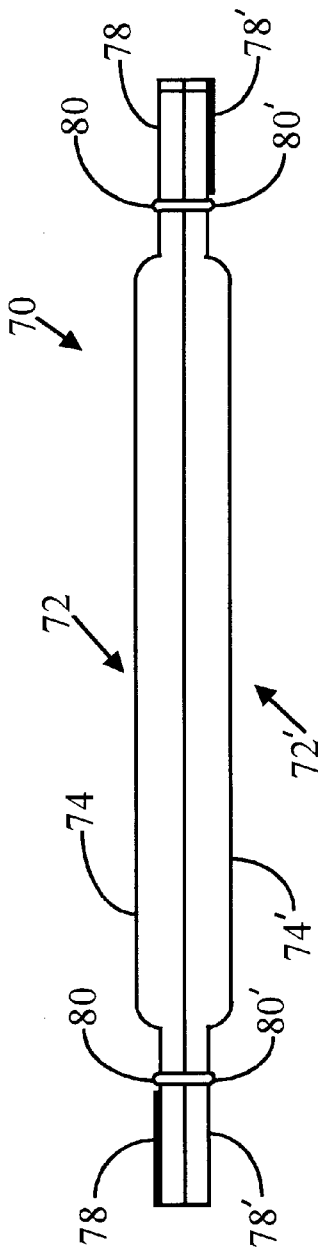
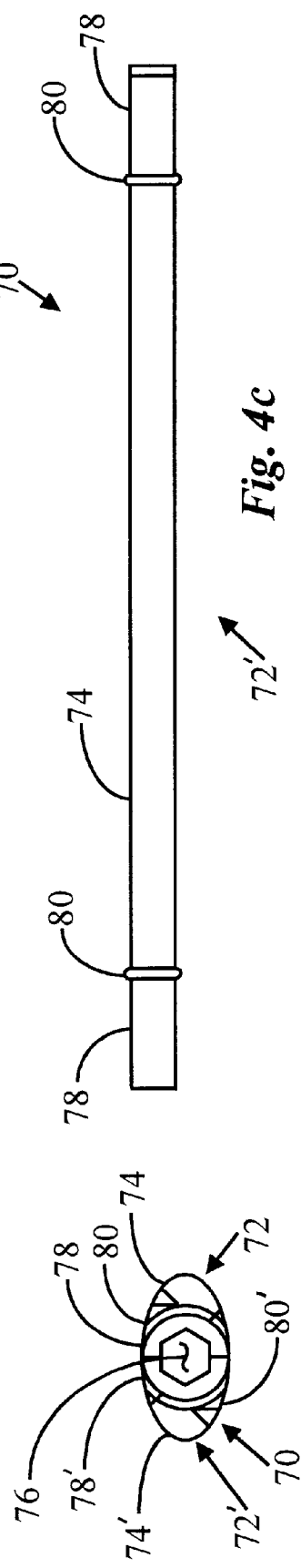
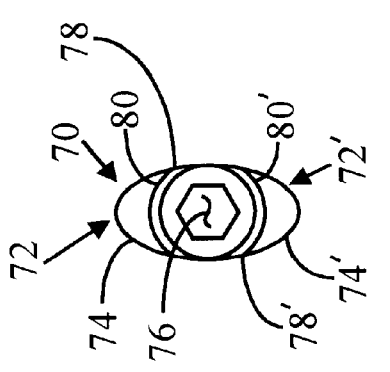
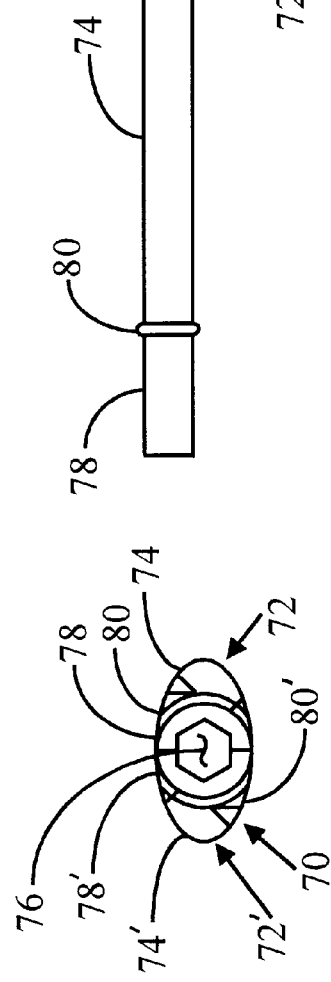
Fig. 4a
Fig. 4b
Fig. 4c
Fig. 4d

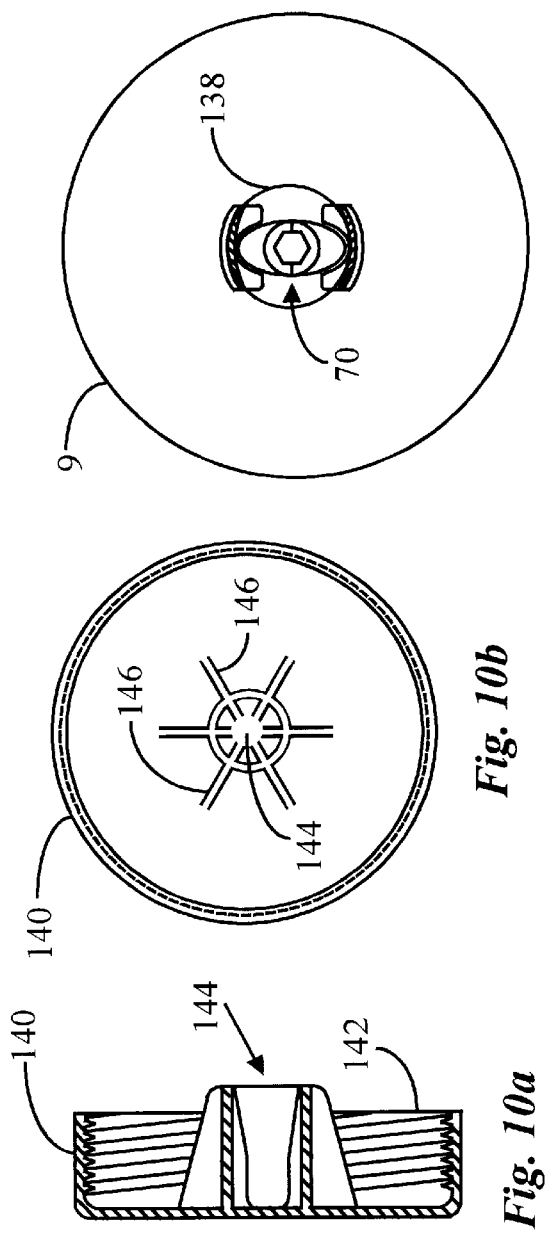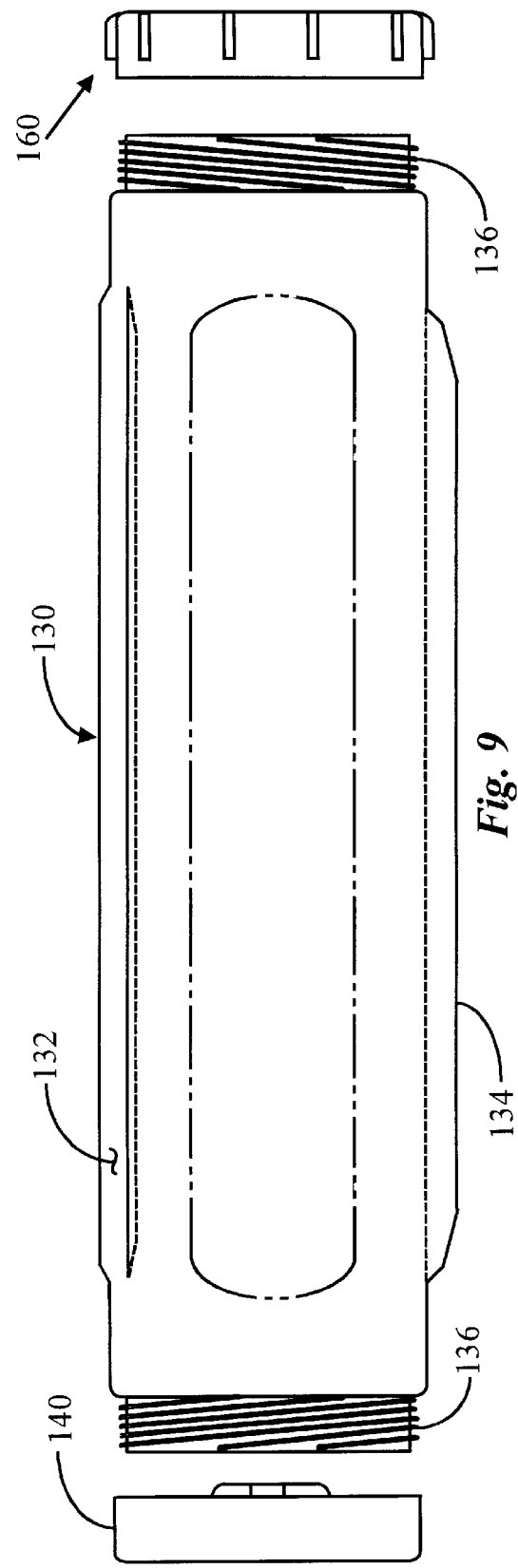

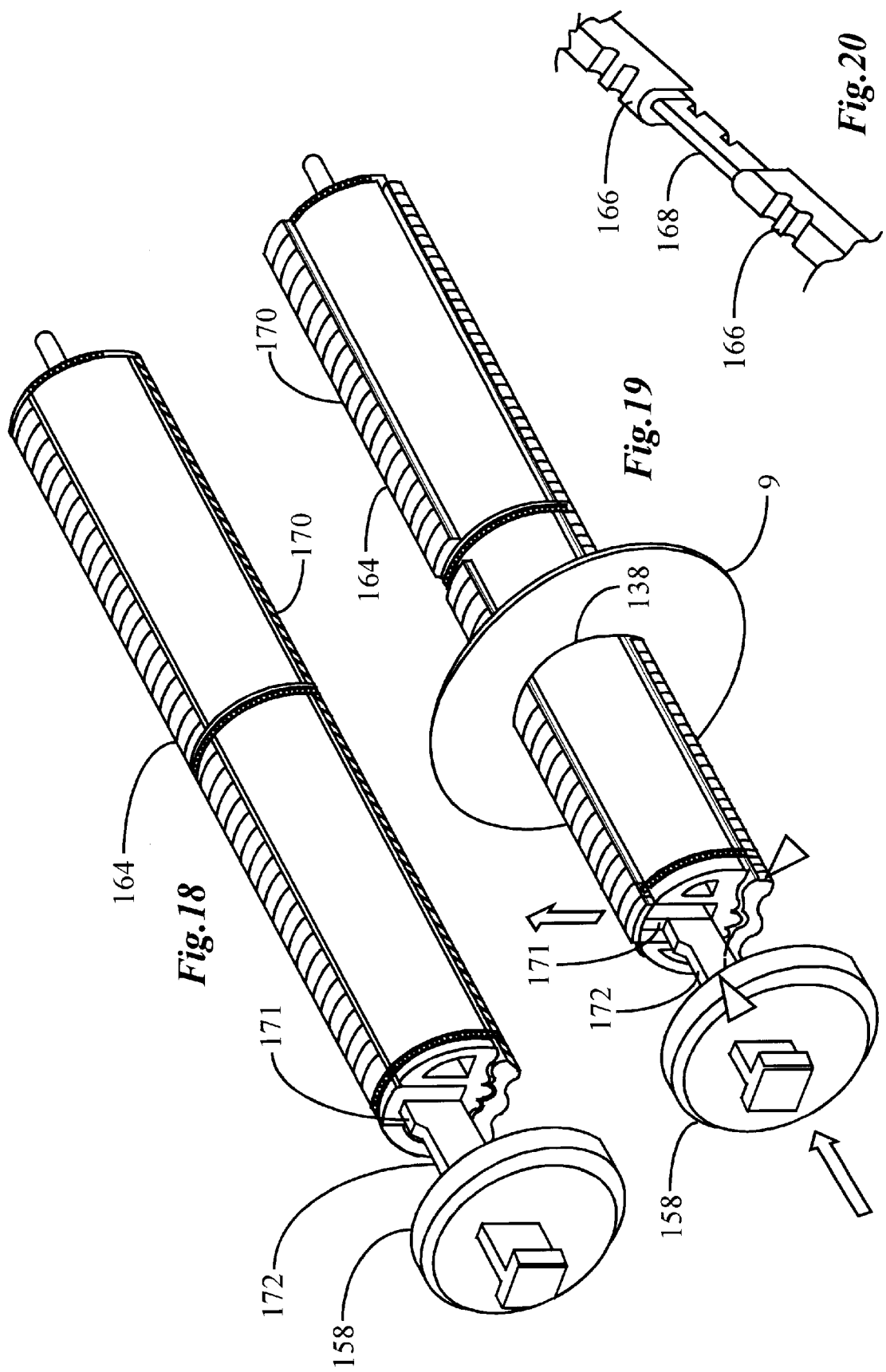

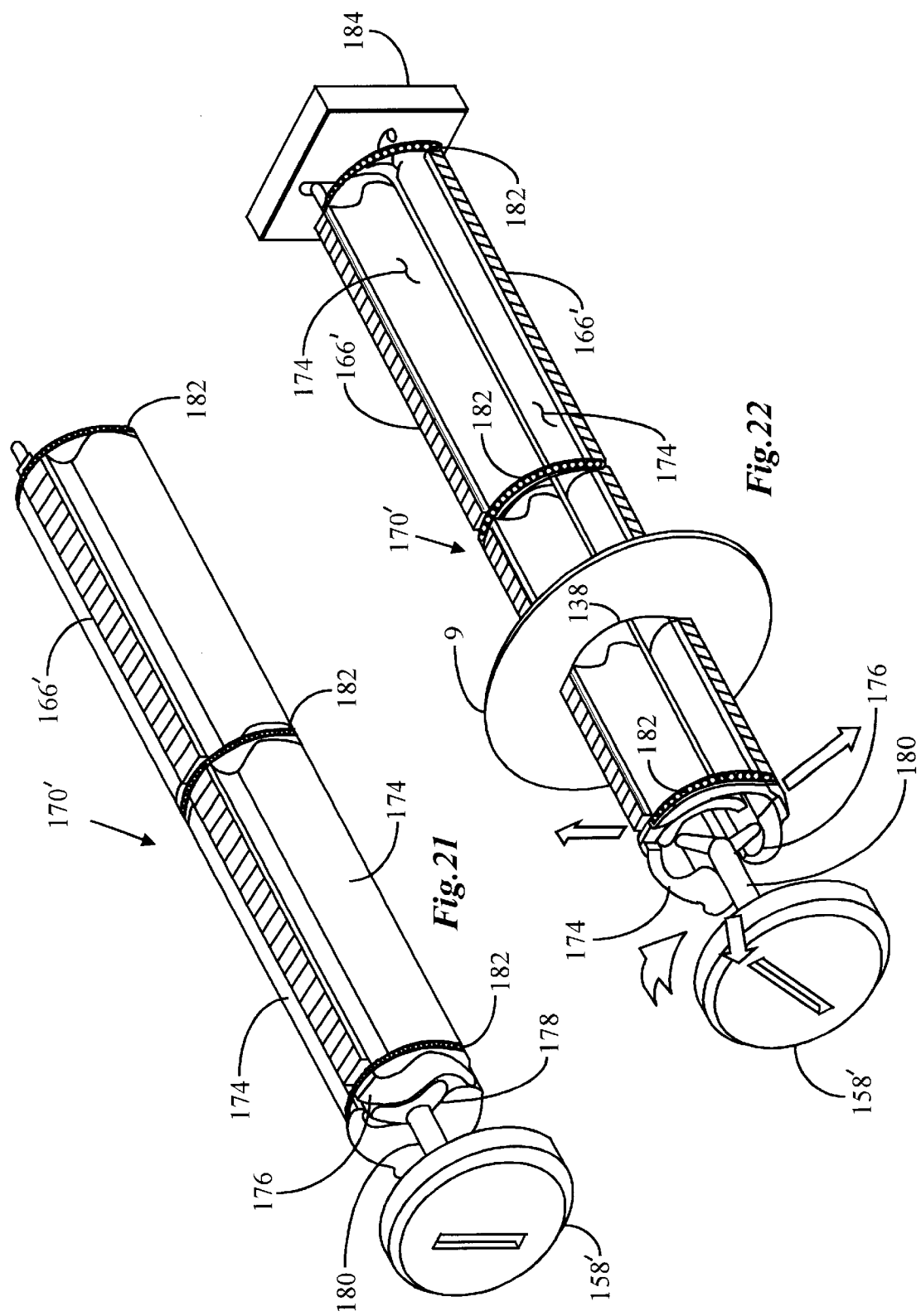

MAGNETIC HARD DISK TRANSPORTATION SYSTEM AND METHOD

This application claims benefit of provisional application Ser. No. 60/103,836 Oct. 9, 1998.

FIELD OF THE INVENTION

The present invention relates to a shipping container and method of securing magnetic disks for computer hard drives during transit of the individual disks before assembly a the drive mechanism. More specifically to a shipping container that both prevents physical contact between a plurality of disks, as well as minimizing contamination of the interior of the shipping container thus reducing the contamination received by each disk during transit.

BACKGROUND OF THE INVENTION

Typically magnetic hard disks for computer hard disk drives are manufactured at a different location from the final assembly point of the complete hard disk drive. Thus transit of the individual magnetic hard disks is necessary in such a way as to minimize damage and contamination of those disks. Presently the magnetic hard disks are manufactured in the United States, while the other components and the final assembly of hard disk drives is typically performed in various countries in southern Asia.

At present the magnetic hard disks are transported in a gondola shaped hard plastic container having spaced-apart interior ridges which curve inward toward the bottom of the gondola to capture a portion of the edge of magnetic hard disks on opposite sides to thus keep the disks separated from each other. These gondolas also have open top and bottom sides, as well as partially open ends to facilitate loading of a full complement of disks into the gondola without them coming into contact with each other during that process. Once the disks are loaded into the gondola, a bottom cover, and combined top and end cap cover are snapped in place on the gondola. Each of the top and bottom covers are made of a softer plastic to permit them to snap in place. Additionally, the top cover includes spaced-apart inwardly projecting tabs that are positioned to correspond to the internal ridges of the gondola which also fit on opposite sides of the edge of each disk at the top of the gondola. The spring action of the snapping of the top cover onto the gondola, together with the closeness of the spacing between the inwardly projecting tabs secures each disk so that the disks do not rattle or otherwise move within the gondola.

There are several problems introduced by the gondola design. First, and most obvious, is the securing to the disks by the outer edge during transit. This has the potential for damaging the outer most tracks on the top and bottom surfaces of the disks. In all other operations the handling of the magnetic hard disks is performed by grasping the disk by the central hole therethrough. Handling the disk at the central hole does not present the same problem since in the final assembly of the hard disk drive, each disk is clamped on a drive spindle through the central hole . Second, the use of two types of plastic in the present shipping gondola assembly results in the introduction of contamination in the form of plastic shavings from the softer top and bottom covers when they are snapped in place on the gondola. That snapping action, together with the type of materials used, places a static charge on those plastic shavings thus almost ensuring that they will migrate and adhere to the surfaces of the magnetic hard disks.

What is needed is a transportation system and method of enclosing the magnetic hard disks for transit that supports the disks by the center hole and which does not introduce contaminates in the shipping container upon loading, closing or opening. The present invention provides such a transportation system and method.

SUMMARY OF THE INVENTION

The present invention provides a supporting spindle and shipping system for shipping hard magnetic disks from the point of manufacture to the final assembly point where those disks are incorporated into hard disk drive for computer use. The spindle is designed to be outwardly expanding to capture and hold the hard disks only by the central hole of each disks such that no disk comes into contact with any other disk. The loaded spindle is then inserted into a shipping tube that has end openings and an interior region where the smallest dimension is considerably larger than the diameter of the disks to be housed within the shipping tube. The spindle is supported within the closed shipping tube by the end caps of the shipping tube so that none of the disks on the spindle come into contact with the interior of the shipping tube. The shipping tube can also be formed to have an exterior shape that facilitates stacking of the shipping tubes. The shipping tube and the end pieces are each made of the same material to minimize the possibility of the creation of contamination within the shipping tube during closure and shipment of the loaded tube. Additionally, an air tight fitting can be proved in one of the end caps to permit the evacuation of the air within the closed shipping tube, and also charging the shipping tube with an inert gas if desired.

BRIEF DESCRIPTION OF THE FIGURES

FIGS. 4a and 4b are top and end views, respectively, of a double cam bar of a first spindle embodiment of the present invention.

FIGS. 4c and 4d are side and end views, respectively, of a double cam bar of the first spindle embodiment of the present invention.

FIG. 8 is end view of an open first spindle of FIG. 7b with a magnetic hard disk captured thereby.

FIG. 9 is an exploded side view of a first shipping tube and end caps of the present invention.

FIGS. 10a and 10b are side cross-sectional and internal plan views of a fixed end cap of the first shipping tube assembly of FIG. 9.

FIG. 18 is a perspective view of a second spindle of the present invention in the relaxed position.

FIG. 19 is a perspective view of a second spindle of the present invention in the extended position.

FIG. 20 is a perspective cut-away view showing an additional lifting point for the lift bar of the second spindle of the present invention.

FIGS. 20 and 21 are perspective views that are similar to FIGS. 18 and 19 showing a cam actuated spindle to raise a modified upper spindle piece.

FIG. 22 is a simplified perspective view of the loading and unloading of the spindles of the present invention of the magnetic disks at the manufacturing and final assembly points.

DESCRIPTION OF THE INVENTION

Figure 1:
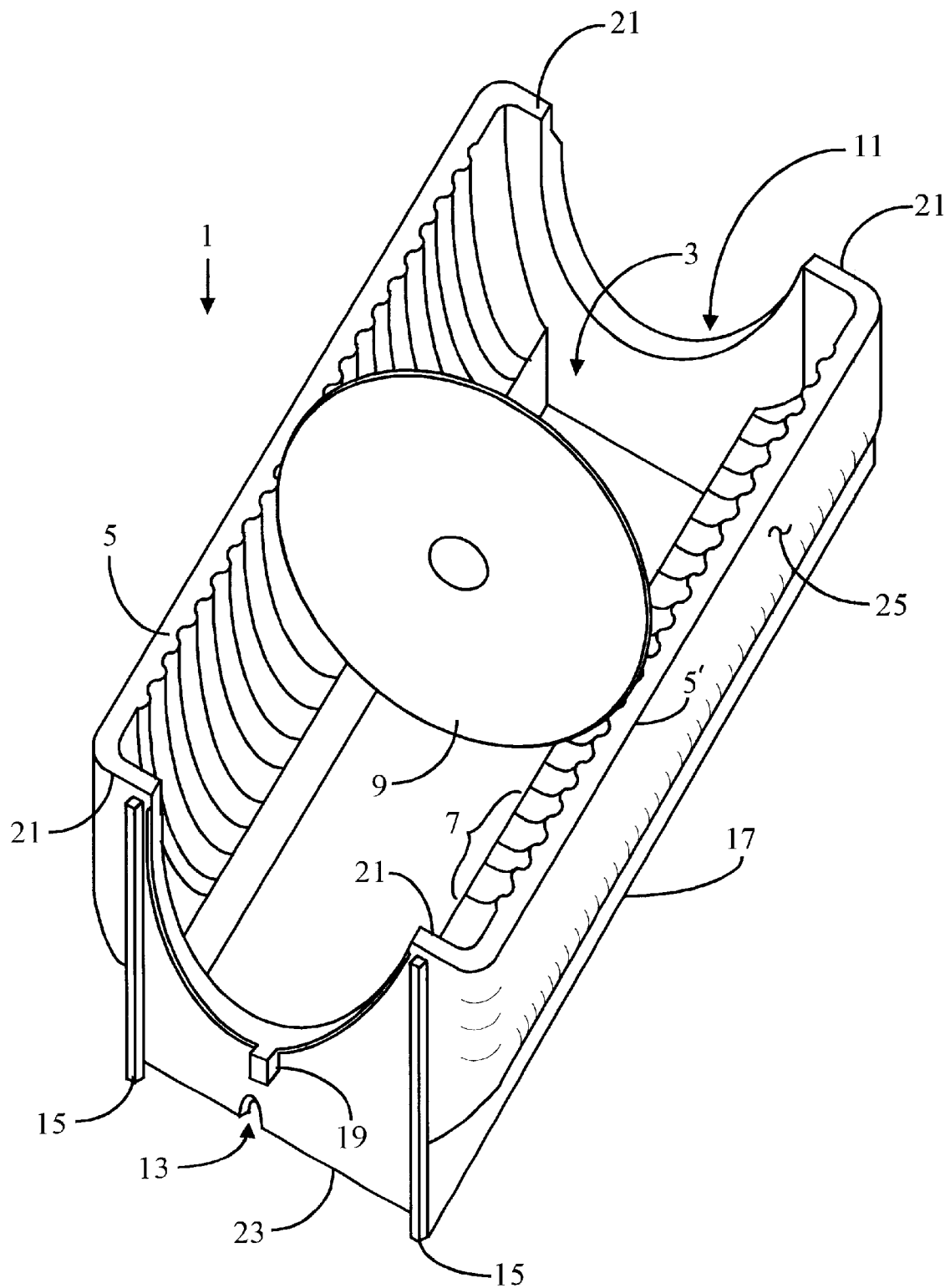
FIG. 1 is a perspective view of the gondola shipping container of the prior art.
Figure 2B:
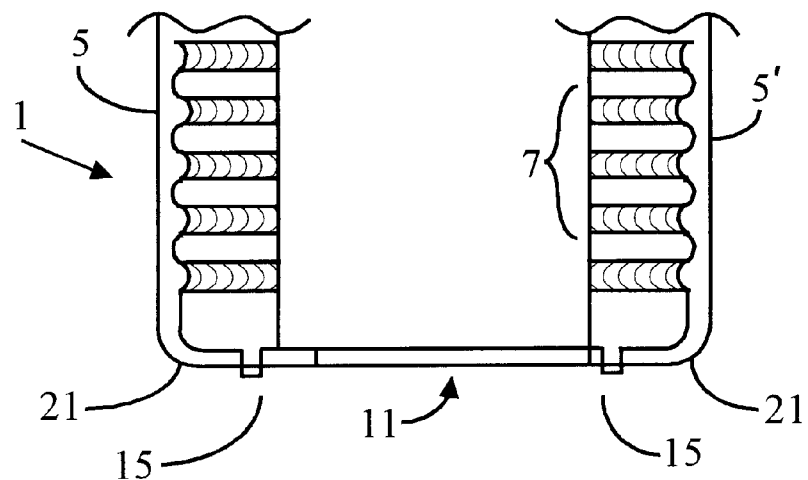
FIGS. 2a, 2b and 2c, respectively, are the end, partial top and partial bottom views of the prior art gondola of FIG. 1.
Figure 2A:
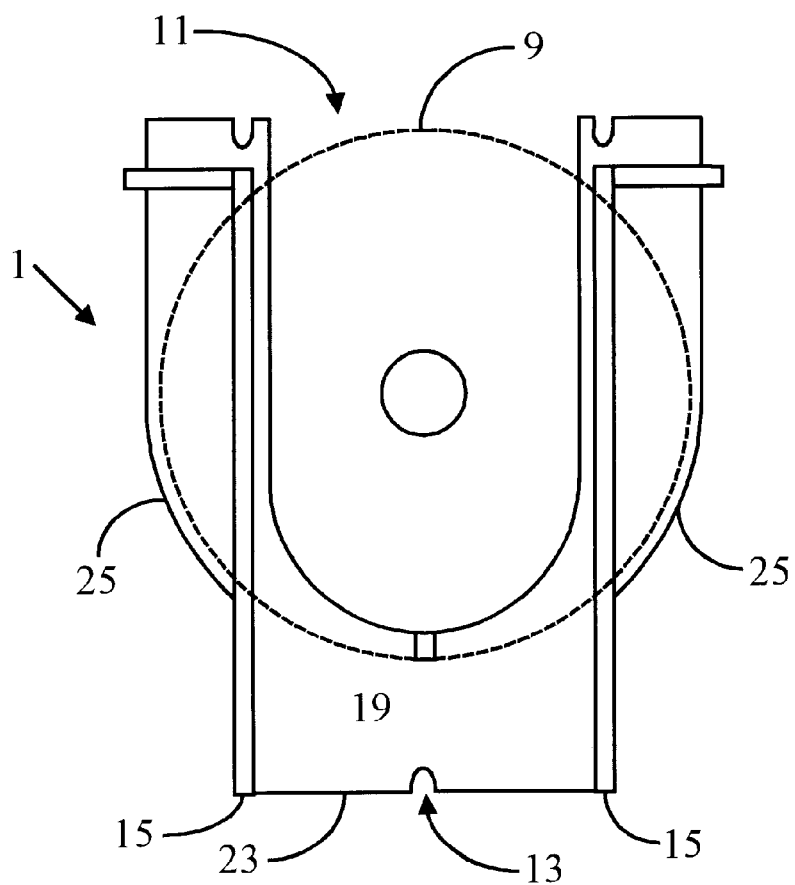
Figure 2C:
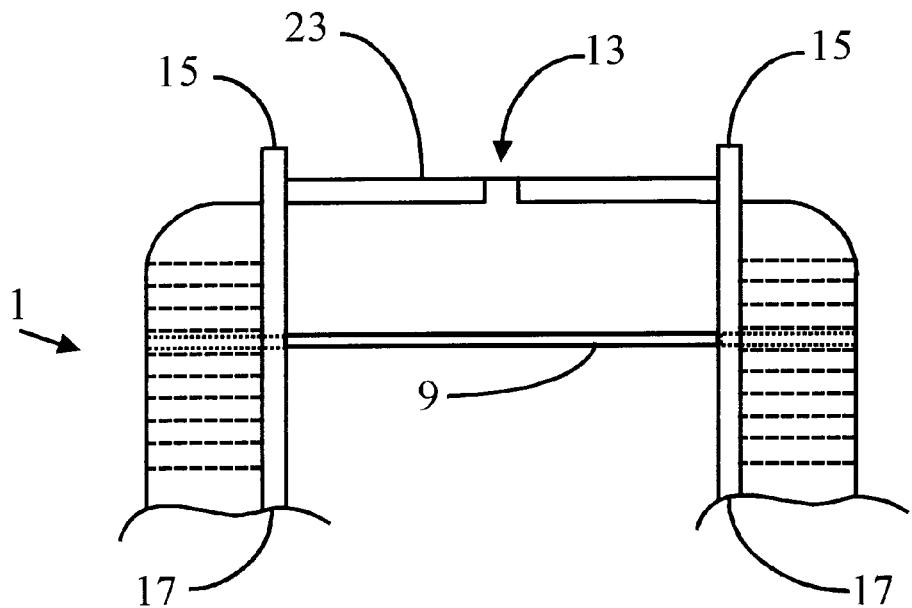
Figure 2D:
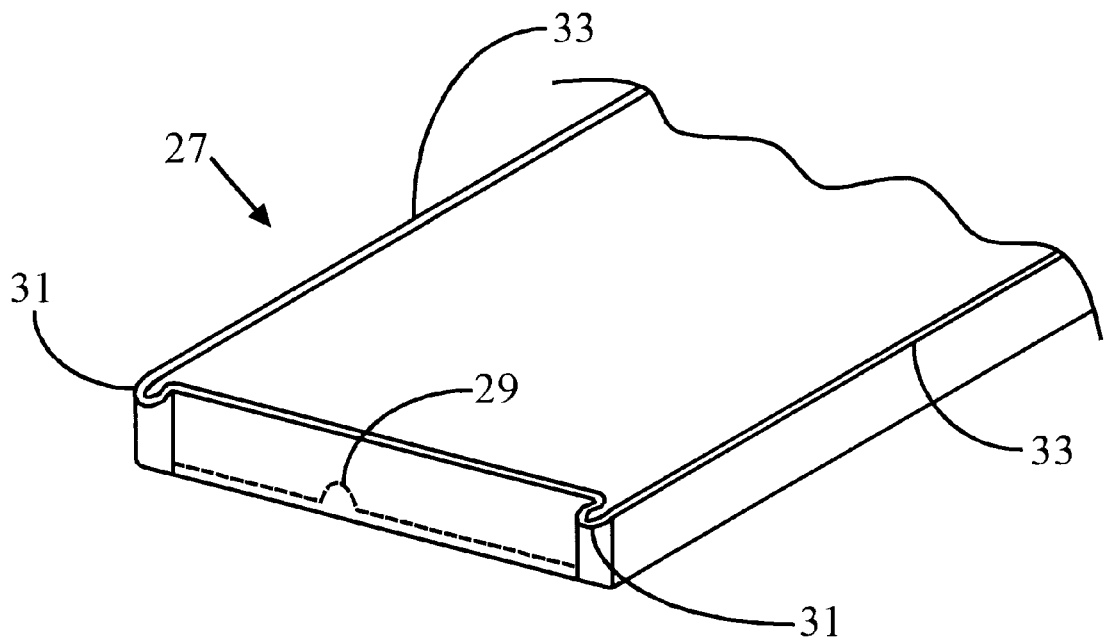
FIG. 2d is a partial perspective view of the bottom cover of the prior art gondola of FIG. 1.
Figure 3B:
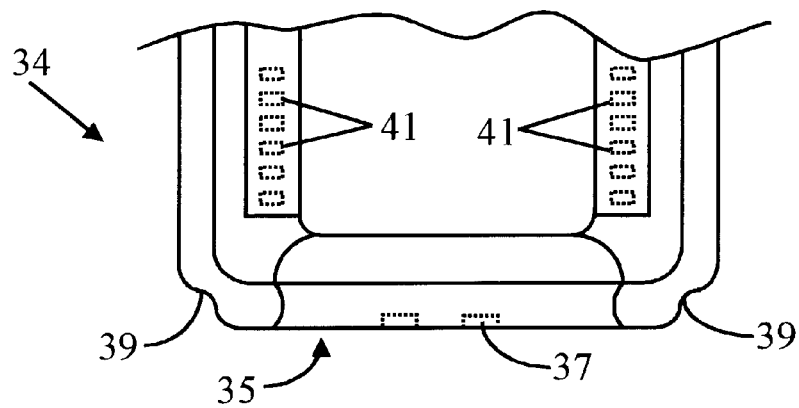
FIGS. 3a, 3b and 3c, respectively, are the end, partial top and partial bottom views of the top cover of the prior art gondola of FIG. 1.
Figure 3A:
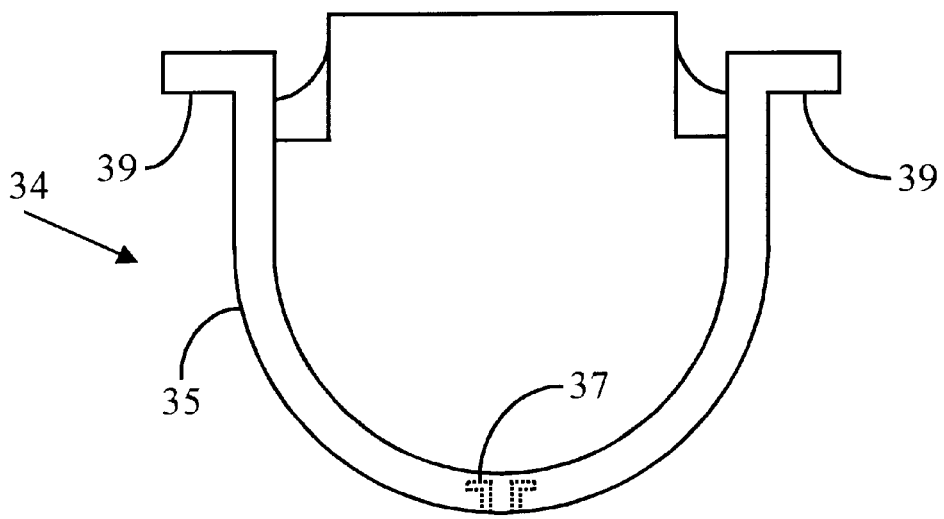
Figure 3C:
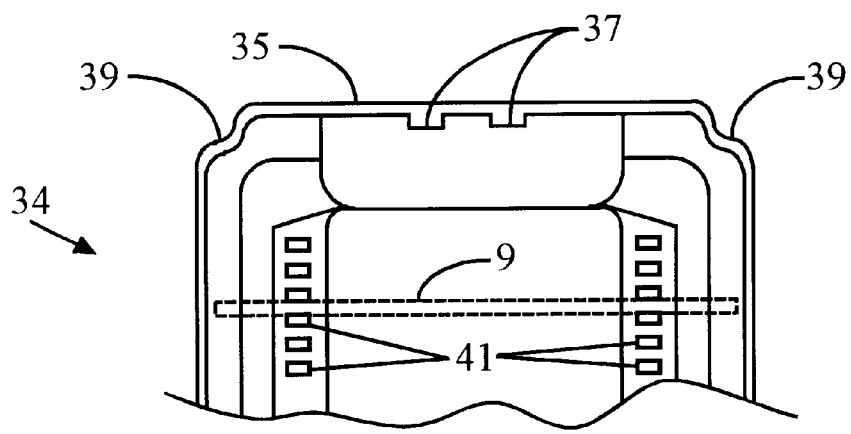

Before discussing the present invention in detail, the figures that are included to describe the prior art system are discussed here. The shipping containing of the prior art consists of three pieces: a gondola 1 of FIGS. 1, 2a, 2b and 2c; a bottom cover 27 of FIG. 2d, and a top cover 34 of FIGS. 3a, 3b and 3c.

As shown in FIGS. 1, 2a, 2b and 2c, the gondola 1 is a hard plastic container (e.g., polycarbonate) having spaced-apart interior ridges 7 which curve toward the bottom 17 to capture a portion of the edge of magnetic hard disks 9 on opposite sides to thus keep disks 9 separated from each other. Gondola 1 also has open top and bottom sides, as well as partially open ends to facilitate loading of a full complement of disks into gondola 1. To facilitate the closure of gondola with bottom cover 27 and top cover 34 (typically top and bottom covers 27 and 34 are made of polypropylene), gondola 1 includes several other features. Those features include top side edge 5, "U" shaped open ends 11 with aligning/locking tab 19, and aligning posts 15, lower side edges 17, top end edges 21, and bottom end edges 23 with aligning notch 13.

Once the disks are loaded into gondola 1, bottom cover 27 (FIG. 2d), and combined to and end cap cover 34 (FIGS. 3a, 3b and 3c) are snapped in place. Bottom cover 27 includes aligning tab 29 to mate with aligning notch 13 in bottom end edge 23 of gondola 1, corner pockets 31 to capture end aligning posts 15 of gondola 1, and side edges 33 to enclose a portion of the outer sides of gondola 1 along edges 17 and 23.

Additionally, top cover 34 includes to end tongues 35 to provide closure of "U" shaped open ends 11 of gondola 1 with aligning/locking tabs 37 on the lower extension of end tongues 35 to mate with aligning/locking tabs 19 of gondola 1. Additionally, top cover 34 includes corner pockets 39 to mate with and enclose top end edges 21 of gondola 1 as well as top side edges 5 and 5'. Top cover 34 also includes spaced-apart inwardly projecting aligning/locking tabs 41 that are positioned to correspond to interior ridges 7 of gondola 1 to fit on opposite sides of the edge of each disk 9 at the top of gondola 1. The spring action of the snapping of the top cover onto gondola 1, together with the closeness of the spacing between inwardly projecting aligning/locking tabs 41 secures each disk 9 so that disks 9 do not rattle or otherwise move within gondola 1. Each of the top and bottom covers are made of a softer plastic to permit them to snap in place.

In the manufacturing process gondola 1, without covers 27 and 34, is used to move disks 9 from station to station, as well as in the final assembly of the hard disk drives. Since disks 9 are typically manufactured in the United States, whereas the final assembly of the disk drives that utilize the disks is typically done in South Asia. It is necessary to transport the finished disks from the United States to the final assembly point in South Asia which was done in the prior art by snapping covers 27 and 34 onto gondola 1. The present invention replaces the manner in which disks 9 are supported, and the container that they are housed in, during shipment. At present it is anticipated that gondola 1 will still be used in the disk manufacturing process, and perhaps at the final assembly point. Thus, the present invention has been designed to interface with disks in gondolas 1 in the preparation for shipment and in the delivery of the disks to the final assembly point. As will be seen below, the present invention is an improved support spindle to hold the disks during shipment and a shipping container which does not come into contact with the disks during shipment. Further, the three pieces of the shipping container of the present invention are made of the same material to minimize the creation of contamination when the shipping container is closed as will be seen below.

The present invention provides a different approach to that of the prior art, both in the way that magnetic hard disks 9 are supported during transport and the point of that support on disks 9. In the system of the present invention, disks 9 are supported by means of the central hole 138 and without the outer edges coming into contact with any portion of the shipping container during transport. Additionally, there are no parts that snap together that can introduce contaminants into the shipping container that can migrate to disks 9.

To fully understand the working of the shipping container embodiments of the present invention and the operation thereof, it is necessary to introduce individual elements that are then assembled to make that shipping container operational.

Referring first to FIGS. 4a–7c there are shown the components and the complete assembly of a first spindle embodiment to capture the disks 9 during transit. FIGS. 4a–4d are several views of a double cam bar 70 portion of the first spindle embodiment. Top and end views, respectively, are shown in FIGS. 4a and 4b, while side and end views, respectively, are shown in FIGS. 4c and 4d. In each view, double cam bar 70 has two cam bar halves 72 and 72'. Each of cam bar halves 72 or 72' include a cam 74 or 74' longitudinally along a substantial portion of the length with semicircular end pieces 78 or 78' at each end. Additionally, set back from each end of end pieces 78 and 78' is a location ridge 80 and 80', receptively, the use of which will become clear when the first spindle assembly of FIGS. 6a and 6b is discussed below. Further, from the end views of FIGS. 4b and 4d it can more clearly be seen that double cam bar 70 is shown as being an assembly of two identical cam bar halves 72, and that the interior space defined thereby is a hexagonal longitudinal passage 76. Typically, cam bar halves 72 will be molded of plastic (e.g., glass/teflon filled polycarbonate [FIBERITE™ RTP 305TFE 15]) to prevent any chemical or electrolytic reaction between disks 9 and double cam bar 70, should they come into contact with each other.

It should be noted at this point that while double cam bar 70 is shown as an assembly of two equivalent halves and that a hexagonal interior passage is defined therewithin, it is not necessary for the operation of the present invention that this two piece combination and, specific interior shape be used. Double cam bar 70 could employ a single piece structure, four quarter structures, or some other combination of pieces to effect the construction thereof. Further, it is also not necessary that a hexagonal interior passage be used. That passage could have any shape with three or more interior surfaces, or cam bar 70 could have a solid interior. This will also become clear when the first spindle assembled structure is discussed below. Also, double cam bar 70 could be made of a variety of materials, including the same material from which disks 9 are manufactured.

Figure 5A:
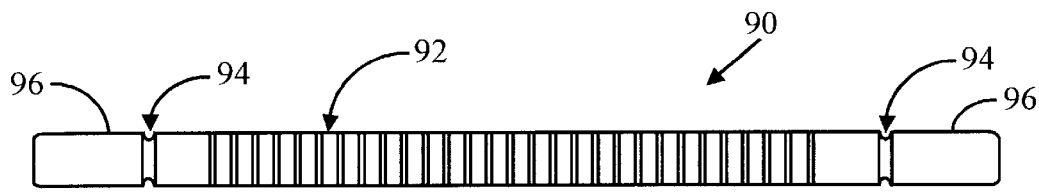
FIGS. 5a and 5b are top and side views, respectively, of a capture bridge of the first spindle embodiment of the present invention.
Figure 5B:
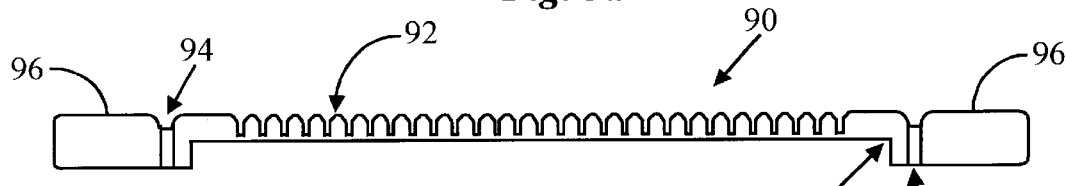

Moving on to FIGS. 5a and 5b there is shown top and side views, respectively, of capture bridge 90, another component of first spindle 110 (FIGS. 6a and 6b) discussed below. Included in capture bridge 90, along a substantial portion of the longitudinal length, is ridged section 92 with each groove between the high points of the ridge disposed to receive a portion of magnetic disk central hole 138 (FIG. 8) and to maintain the surfaces of magnetic hard disks 9 substantially parallel to each other when mounted on spindle 110, as discussed below. Additionally, at each end of capture bridge 90, with ridged section 92 therebetween, are semicircular end pieces 96 that define a semicircular outer surface, as well as an arc of a semicircle to mate with the semicircular outer surface of end pieces 78 of double cam bar 70. Finally, each end piece 96 defines a retaining spring or "O" ring groove 94 which is utilized for the assembly of first spindle 110. Further, at either end of ridged section 92, and as part of the inner surface of capture bridge 90, are shoulders 98, the importance of which will become clear when assembled first spindle 110 is discussed below. Typically, capture bridge 90 will also be molded of plastic (e.g., glass/teflon filled polycarbonate [FIBERTIE™ RTP 305TFE 15]) to prevent any chemical or electrolytic reaction between disks 9 and capture bridge 90 when they come into contact with each other during transport.

Figure 6A:
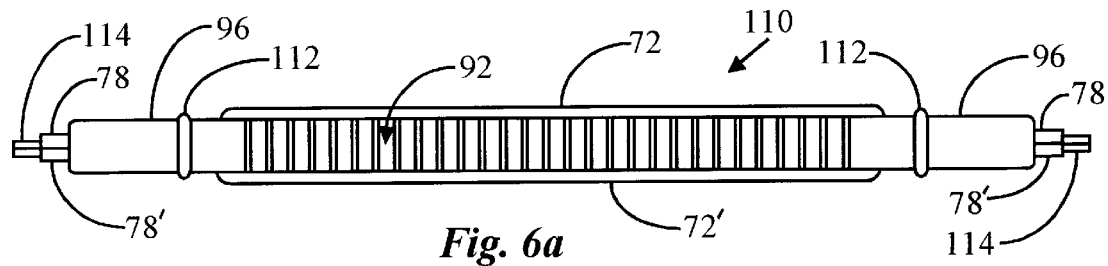
FIGS. 6a and 6b are top and side views, respectively, of the first spindle assembly of the present invention.
Figure 6B:
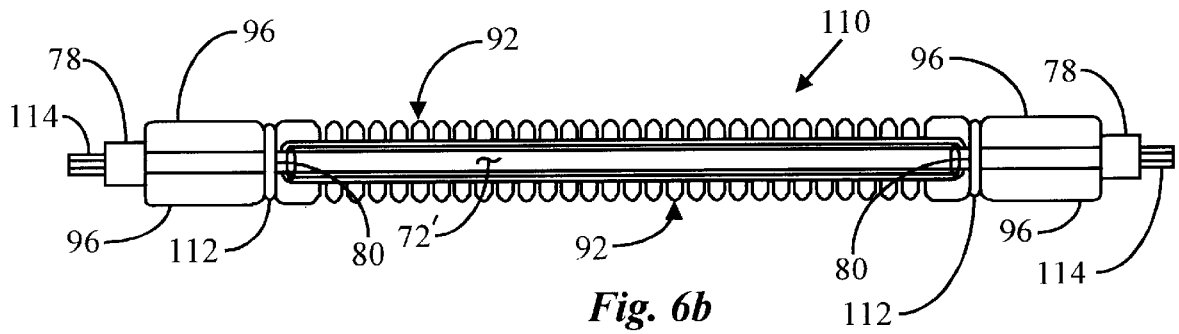

Now that double cam bar 70 and capture bridge 90 have been introduced, first spindle assembly 110 of FIGS. 6a and 6b can be discussed. First, to orient the reader, FIGS. 6a and 6b illustrate top and side views, respectively, of first spindle assembly 110 that is in the closed configuration. It can be seen that first spindle assembly 110 includes a double cam bar 70 as a longitudinal interior element as evidenced by cams 72 and 72' and semicircular end pieces 78 and 78'. As can be seen in these views, location ridges 80 on double cam bar 70 locate the cam bar between shoulders 98 of capture bridges 90.

Figure 7A:
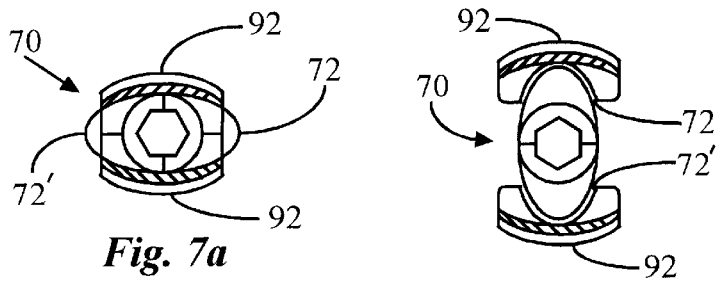
FIGS. 7a and 7b are spindle closed and spindle open vertical cross-sectional views, respectively, of the first spindle assembly of FIG. 6b.
Figure 7B:
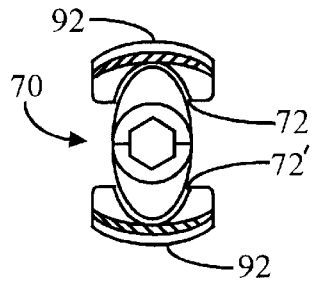

Next, in FIG. 7a there is an end view of the assembled first spindle assembly 110 with each of capture bridges 90 in the relaxed position and the major lobes of cam bar 70 are extended through the sides spaces between the two capture bridges 92. Similarly, in FIG. 7b there is also and end view of first spindle assembly 110 with each of capture bridges 90 in the extended position and the major lobes of cam bar 70 positioned beneath ridged sections 92 forcing them outward, as they would be when the central holes of the collection of disks are each captured top and bottom by the grooves of ridged sections 92. The capturing of a disk 9 is shown more clearly in FIG. 8.

Figure 13A:
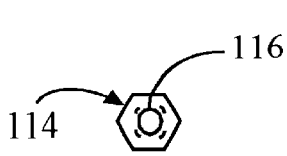
FIGS. 13a and 13b are end and partial longitudinal views of a hex shaft of the first spindle assembly of FIGS. 6a and 6b.
Figure 13B:
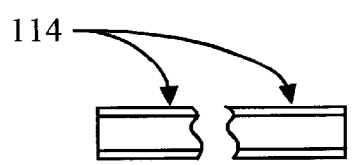

Each of FIGS. 6a, 6b, 7a, 7b and 8 show a hex shaft 114 within the center hex longitudinal passage 76 of spindle 110 that extends beyond the end of the other constituent parts of the spindle to facilitate turning of the cam lobes within the first spindle assembly to either lock on or release disks 9 from spindle 110. Additional details of hex shaft 114 are shown in FIGS. 13a and 13b. There it can be seen that there is a tapped hole 116 in at least one end of hex shaft 114 to facilitate the insertion and removal of the shaft to/from first spindle assembly 110. Additionally, tapped hole 116 at one end of hex shaft 114 can be used to: 1) rotate double cam bar 70 between capture bridges 90 to rotationally secure disks 9 to spindle 110; 2) mate with a post or screw in the center of end cap 160 of the shipping container 130 (FIG. 9); and 3) to abut the opposite end cap 140 of shipping tube 130 when the loaded spindle 110 is fully inserted within shipping tube 130 and end cap 140 is also screwed in place (FIGS. 10a and 10b) mating with screw threads 136, as is end cap 160 at the opposite end of tube 130.

Figure 7C:
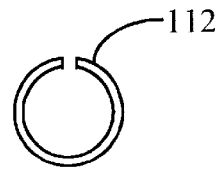
FIG. 7c is a plan view of a retainer spring of the present invention.

FIG. 7c has been included to illustrate retaining spring 112, one of which is used at each end of spindle assemble 110 to hold each of the component pieces of spindle 110 together.

Figure 11:
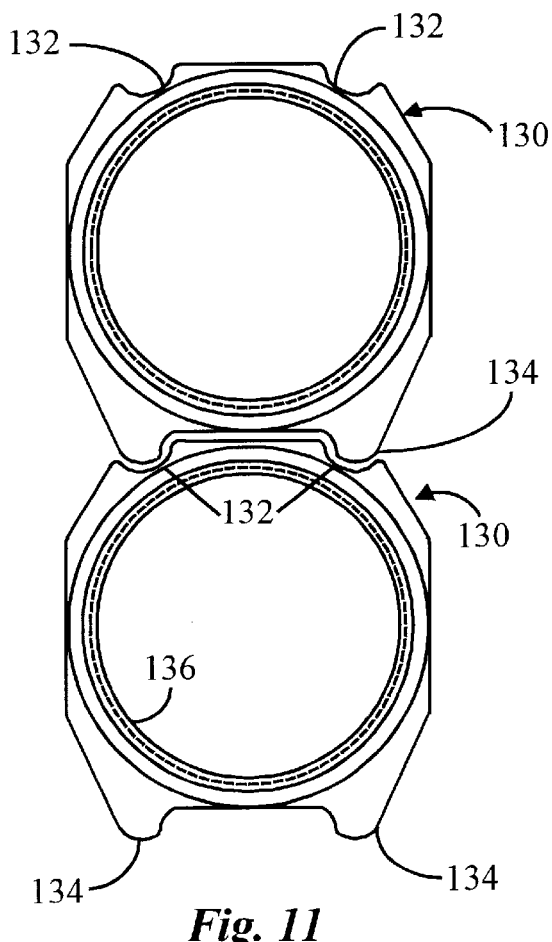
FIG. 11 is an end view of two first shipping tubes of FIG. 9 shown stacked one on top of the other.

FIGS. 9–12 illustrate the features of a first embodiment shipping container in which the loaded spindle 110 is securely mounted for transit. FIG. 9 is a side view of shipping tube 130 having threaded openings 136 at each end to which threaded end caps 140 and 160 mate. Longitudinally along the top portion of the body of tube 130 are stacking indentations 132 (one on either side) and stacking feet 134 along the bottom portion (one on each side) that fit into stacking indentations 132 when one shipping tube 130 is stacked on top of a second shipping tube 132 as shown in FIG. 11. Tube 130 and end caps 140 and 160 are all made from the same material, one that is substantially ridged and clear so that the insertion of the loaded spindle can be observed to prevent damage to the disks as they are loaded into, or removed from, shipping tube 130. By making all pieces of the shipping tube of the same material, and using screw threads for attachment of the end caps, overcomes the "shaving" of the cover material as in the prior art when the covers are clocked into place.

Figure 12:
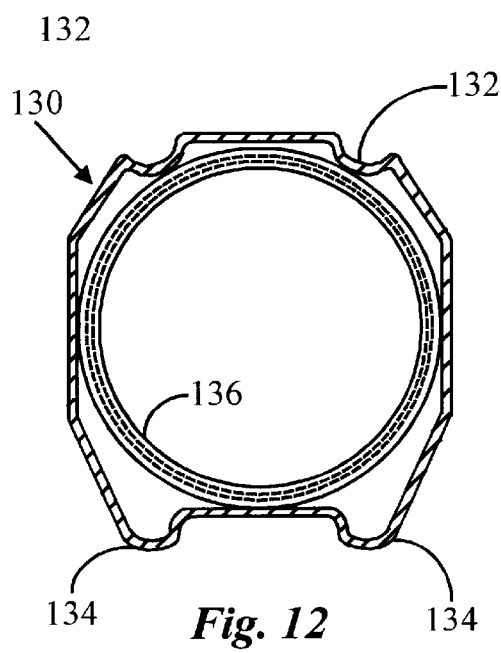
FIG. 12 is a vertical cross-sectional view in the center of the first shipping tube of FIG. 9.

From FIGS. 11 and 12 it can be seen that shipping tube 130 has a truncated square cross-section appearance with a large round opening at each end, with the diameter of that opening being substantially larger than the diameter of the disks to be shipped in the tube, and the interior cross-section of tube 130 being still larger than that of the open ends of tube 130. The functioning of stacking indentations 132 and feet 134 are also clearly shown.

FIGS. 10a and 10b are side cross-sectional and internal plan views of end cap 140 of the shipping tube assembly of FIG. 9. Within end cap 140 there is a centrally located spindle receptacle 144 to accommodate semicircular end pieces 78 and the end of hex shaft 114 when spindle 110 is in place within tube 140 and advanced to end cap 140 as will be seen below. Also shown in FIG. 10b, spindle receptacle 144 is surrounded by six inwardly sloping vanes 146 to assist in seating of the corresponding end of spindle 110 when being loaded into tube 130. The same six vanes 146 are aligned with each one of the flats on hex shaft 114 when the end of spindle 110 is seated and in place thus preventing spindle 110 from rotating within shipping tube 130 during transit.

End cap 160 does not have the internal structure of end cap 140 instead there is merely a centrally located hole to accommodate a screw through end cap 160 to mate with trapped hole 116 in the end of hex shaft 114.

In the loading process of a shipping tube 130, a screw if first passed through the central hole in end cap 160 and screwed into trapped hole 116 in the proximate end of hex shaft 114 thus supporting spindle 110 in cantilever fashion from end cap 160 so that spindle 110 can rotate with respect to end cap 160. With end cap 160 held to support spindle 110 horizontally, spindle 110 is passed through center hole 138 of a plurality of disks 9 in gondola 1. Next cam 70 is rotated and locked in place to spread capture bridges 90 apart from each other thus capturing center hole 138 of each disk 9 in a different groove in ridged section 92 of each capture bridge 90 and locking disks 9 to spindle 110 only at central hole 138. End cap 140 is then screwed to one end of shipping tube 130. Then the distal end of spindle 110 is passed into the open other end of shipping tube 130 and advanced to end cap 140 at the opposite end of shipping tube 130. As the distal end of spindle 110 is advanced toward end cap 140, spindle 110 first comes into contact with vanes 146 which direct the end of spindle 110 to receptacle 144 in the center of end cap 140 with the flats of hex shaft 144 each seating adjacent a different one of vanes 146. Then as end cap 160 is screwed onto the open end of shipping container 130, the distal end of spindle 110 remains stationary with respect to end cap 140 and end cap 160 rotates relative to the proximate end of spindle 110. With both end caps 140 and 160 in place at opposite ends of shipping tube 130, spindle 110 and the disks loaded thereon are supported within, and spaced apart from the interior surfaces of, shipping container 130. In this configuration, spindle 110 is only supported at each end thereof.

To remove disks from shipping container 130, the reverse of the loading process is performed with disks 9 being lowered into a gondola 1 at the final assembly point. Cam 70 is then rotated to free disks 9 and spindle 110 withdrawn from central hole 138 of the disks 9.

The second embodiment of the present invention, shown in FIGS. 14–20, is built around the same principles as the first embodiment, both with respect to the spindle and the shipping tube.

Figure 15:
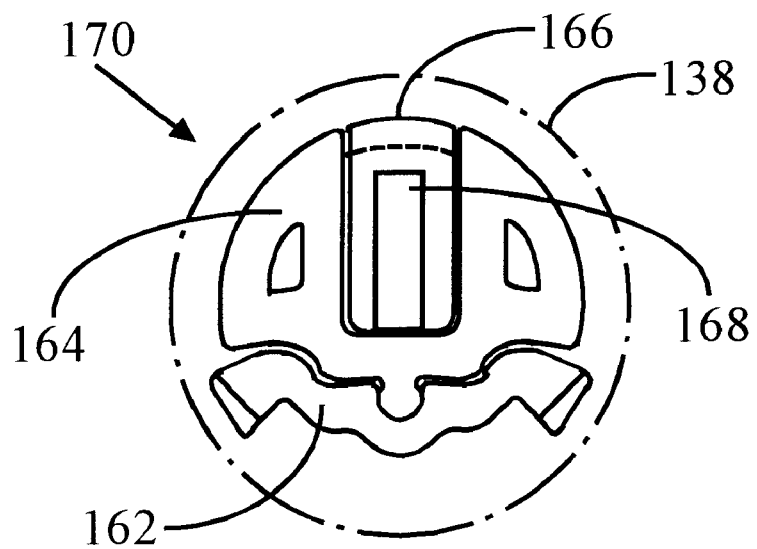
FIG. 15 is an end view of the second spindle of the present invention in the relaxed, unloaded position.
Figure 16:
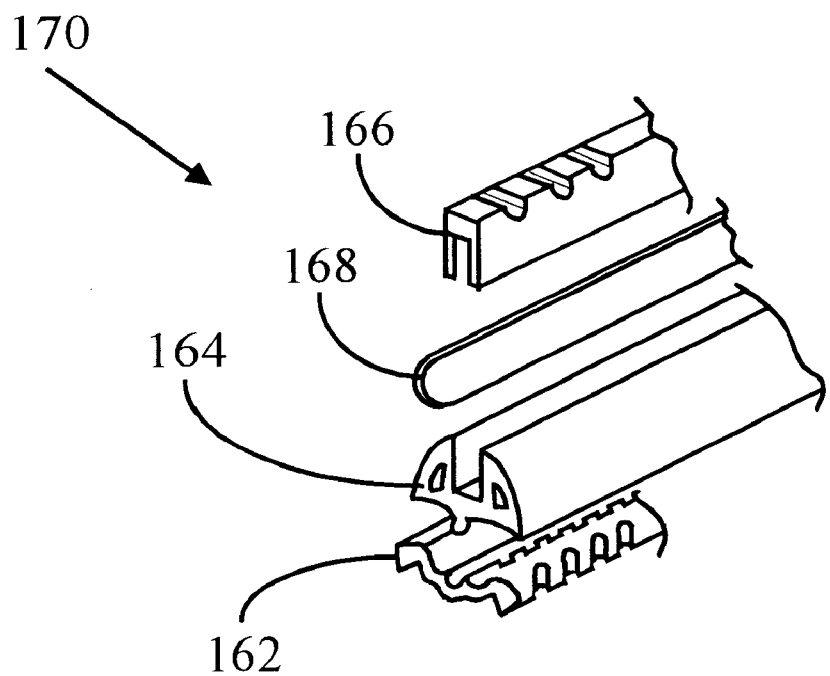
FIG. 16 is an exploded perspective view of the second spindle of the present invention.

As shown in FIGS. 15 and 16, the second embodiment spindle 170 consists of four component parts, each running the full length of spindle 170 with the exception of lifting bar 168 which may run slightly beyond each end to facilitate its lifting. Along the bottom of these views there is a flexible piece 162 (e.g., Lexan™) having a rounded groove running the full length of the top edge thereof and two fingers extending outward at approximately 120° with respect to each other. This configuration is repeated along the entire length of piece 162 with each pair of fingers spaced apart, and parallel to, the nearest other two fingers by a distance substantially equal to, or sightly less than, the thickness of disks 9. Thus, the spacing between disks 9 when loaded on spindle 170 is substantially equal to the thickness of each pair of fingers 162. As will be seen in the following discussion, these two fingers are two of the three points that will contact each side of the edge of central hole 138 of disks 9 when locked to spindle 170.

Immediately above flexible piece 162 is a substantially "U" shaped piece 164 having a bead along the entire length of the bottom thereof to mate with the rounded groove along the top of flexible piece 162. Since "U" shaped piece 164 will not come into contact with disks 9, it can be made of any ridged material (e.g., aluminum). Within the "U" shaped notch of the "U" shaped piece 164 are the remaining two pieces of second spindle 170. One of those two pieces is a "U" shaped plastic piece 166 (e.g., Lexan™) that is inverted with a rounded top edge and a plurality of grooves defined along the full length of the upper edge of piece 166. The grooves in piece 166 are spaced apart from each other a distance that is substantially equal to the thickness of fingers 162 of flexible piece 162, substantially aligned with the spaces between each pair of fingers of flexible piece 162, and have a width that is substantially equal to, or less than the thickness of a disk 9. Further, piece 166 is made of plastic since the grooves in the rounded top edge thereof provide the third point of support for each of disks 9 when mounted on second spindle 170.

The final piece of second spindle 170 is a flat bar 168 that fits within the longitudinal "U" shaped groove of, and beneath, piece 166. Since bar 168 does not come into contact with disks 9 it too can be made of any ridged material (e.g., aluminum). The purpose of bar 168 is to lock disks 9 on spindle 170 when bar 168 is lifted thus extending piece 166 upward and away from fingers 162 to capture central holes 138 of disks 9 in the top grooves of piece 166 and between consecutive pairs of fingers on flexible piece 162.

Figure 17A:
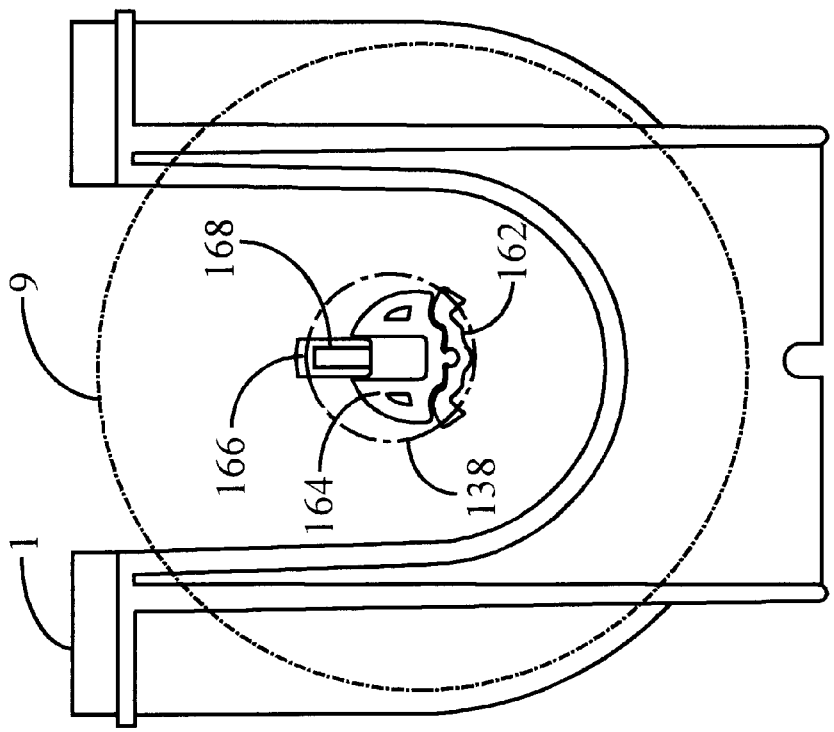
FIGS. 17a and 17b are end views of prior art gondolas containing disks that are being loaded onto the second spindle.
Figure 17B:
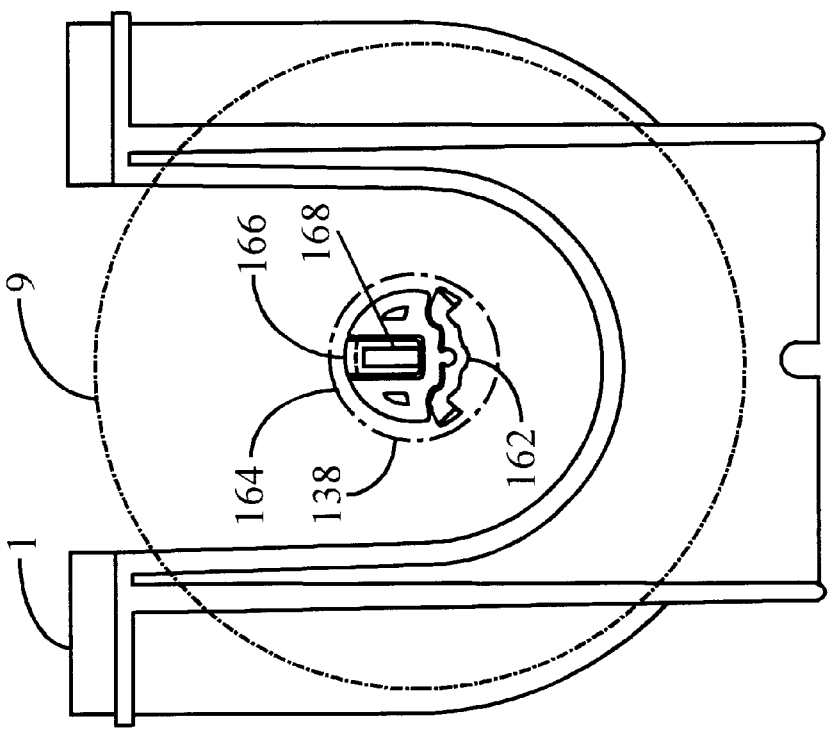
Figure 23:
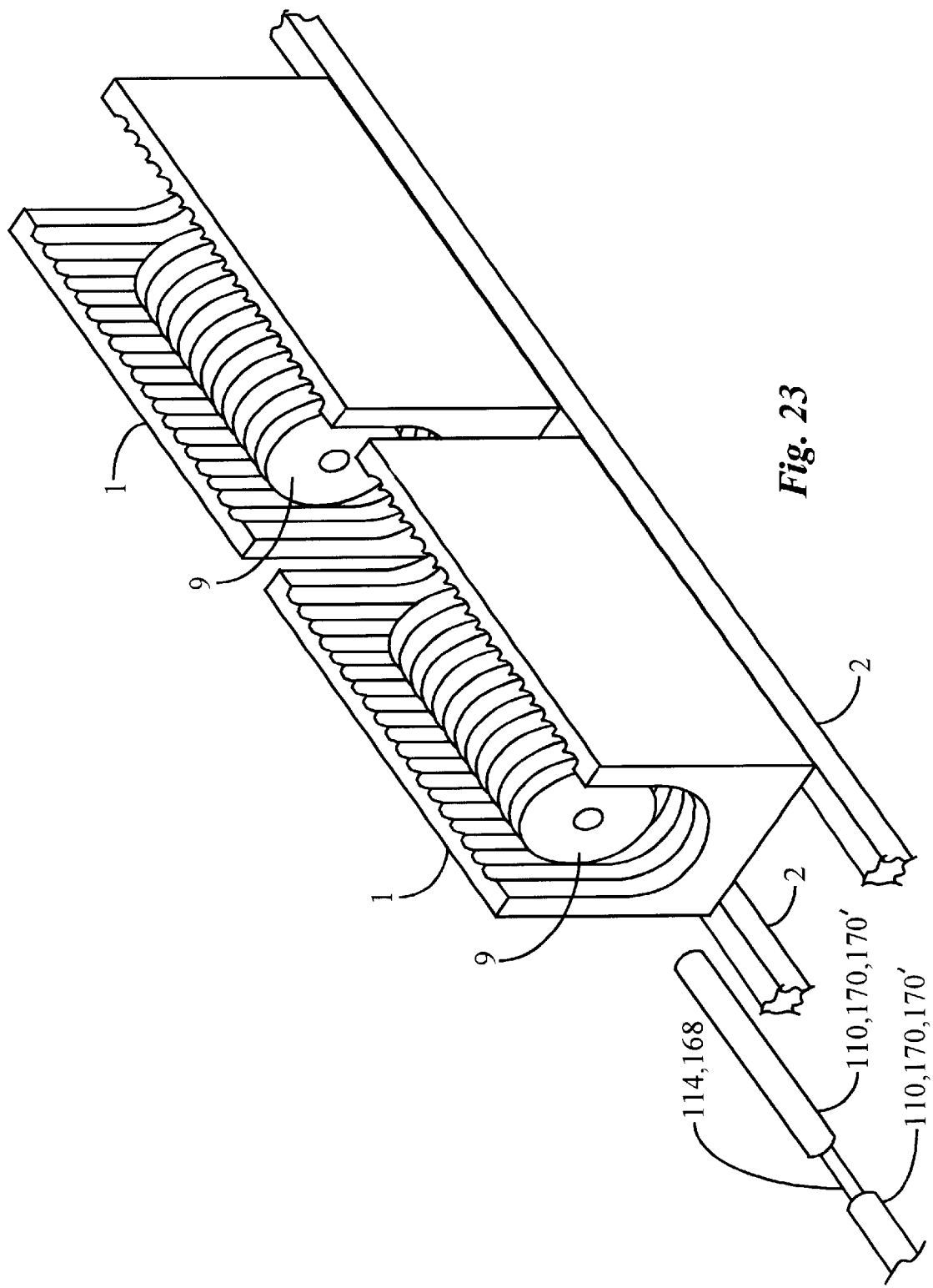
FIG. 23 is a view of two gondolas on a pair of rails to transfer disks from each gondola onto a spindle of the present invention.

Since memory disk for disk drives when they are manufactured are transported during that process in the prior art gondola 1, FIGS. 17a and 17b show the loading of disks 9 in gondolas 1 onto spindle 170. In FIG. 17a, spindle 170 in the relaxed configuration is shown as having been inserted through central holes 138 of disks 9 in gondola 1. Once spindle 170 is fully inserted through central holes 138 of disks 9, lifting bar 168 is moved upward in relation to flexible piece 162, thus capturing disks 9 as describe above and shown in FIG. 17b. Once captured, second spindle 170 can be lifted straight upward to remove disks 9 from gondola 1.

Once lift bar 168 has been lifted, note vacant space 171 in "U" shaped piece 164 beneath lift bar 168 and plastic piece 166. To maintain and lock bar 168 and piece 166 in the extended position it is necessary to place a wedge 172 in space 171 (see FIGS. 18 and 19) at both ends of second spindle 170. At one end of spindle 170, end cap 158 with wedge 172 attached to the interior surface thereof is inserted in the proximate end of second spindle 170 with wedge 172 extending at least partially into vacant space 171 while a free wedge 172 is inserted at the opposite end of spindle 170 with free wedge 172, when fully inserted, being substantially flush with the distal end of second spindle 170.

Figure 14:
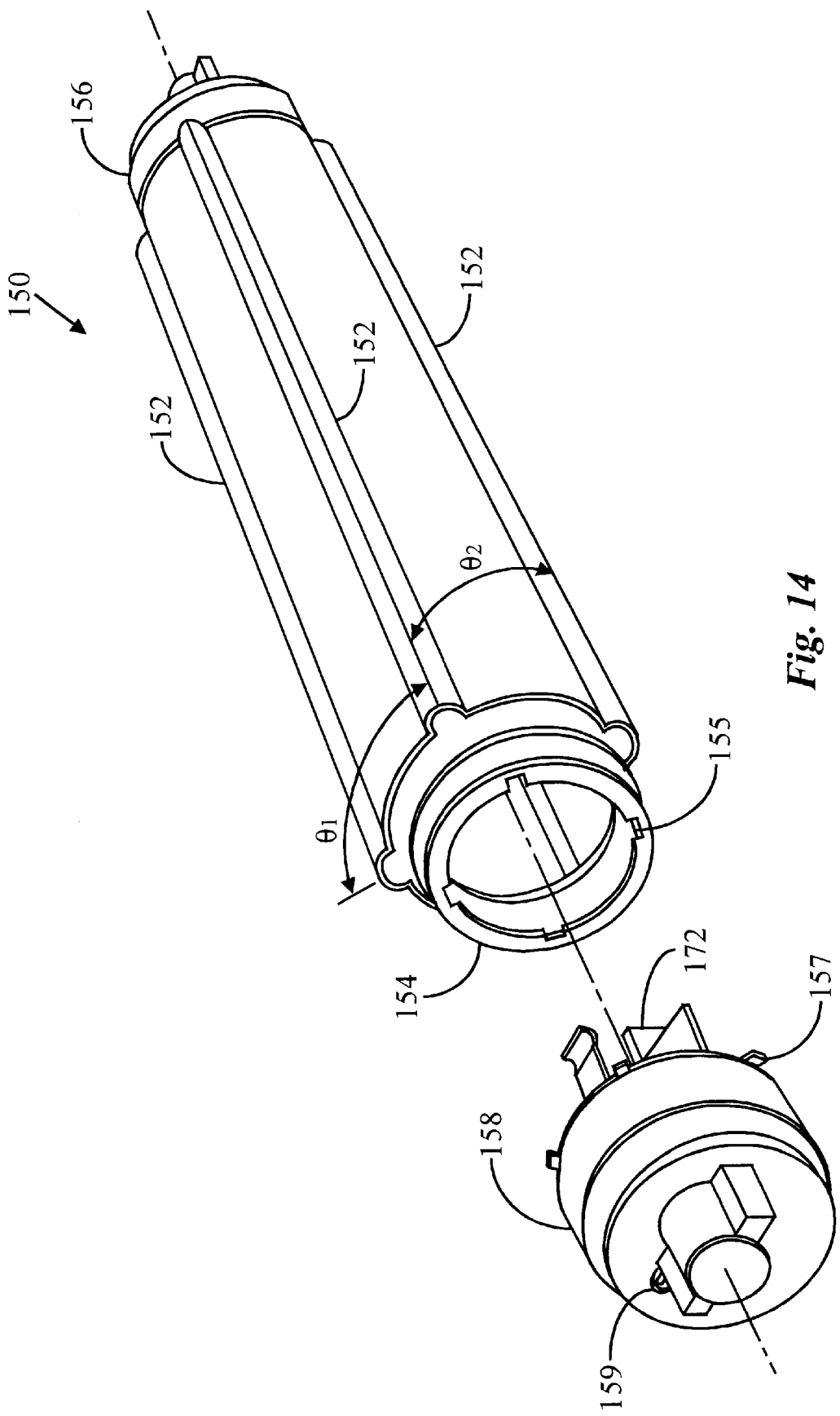
FIG. 14 is a perspective view of the second shipping tube of the present invention.

In FIG. 14 there is shown a second embodiment shipping tube 150 that is similar to the first embodiment shipping tube 130 discussed above. Tube 150, like tube 130, is longer than the length of the spindle that is to house, has circular opening at both ends 154 with a diameter that is larger than the diameter of disks 9, and an interior cross-section that is still larger than the diameter of ends 154. One of the differences between shipping tubes 130 and 150, is the shape and placement of stacking lobes 152 on tube 150. Here each of stacking lobes 152 has the same generally semi-circular shape as each other. To provide the ability to stack tubes 150 on top of each other, lobes 152 are not spaced an even 90° from each other around the periphery of tube 150. Instead they are located alternately $\theta_1$ and $\theta_2$ degrees from each other (e.g., $\theta_1$ being 110° and $\theta_2$ being 80°) so that a stack of tubes 150 would not only have stability vertically, but also horizontally. When stacking tubes 150, assuming the first tube is oriented as is tube 150 in FIG. 14, the next tube 150 when placed on top of that first tube is turned 90° so that the lobes 152 that are $\theta_2$ degrees apart fit between the lobes 152 that are $\theta_1$ degrees on the lower tube 150. This orientation is continued as the stack height is increased by alternating the orientation of each successive tube in the stack. Then in the stacks on either side of that stack, the first tube 150 is oriented 90° from the orientation of tube 152 in FIG. 14 sot hat lobes 152 on the sides of tubes 150 in adjacent stacks are $\theta_2$ degrees apart on the bottom tube 150 (as in FIG. 14) in the first stack fit between the lobes 152 that are $\theta_1$ degrees apart on the lower tube 150 in the adjacent stack. As in the first stack, the next tube in the adjacent stacks is first turned 90° so that on the sides of the stacks the orientation of lobes 152 varies $\theta_1$ opposite $\theta_2$, then $\theta_2$ opposite $\theta_1$, and so on.

Another difference between tubes 130 and 150 is that end caps 156 and 158 do not screw tube 150. In tube 150 several notches 155 are formed (i.e., four as shown in FIG. 14) around the periphery of the opening in ends 154, with locking tabs 157 formed on end caps 156 and 158 to mate with notches 155 and to lock in place with a small angular twist of the end cap relative to tube 150 (i.e., perhaps a twist of 20–30°). As was discussed above, end cap 158 performs a function that is similar to end cap 160 in that it supports spindle 170 cantilever fashion once wedge 172 attached thereto is inserted into the end of loaded spindle 170. End cap 156 is similar to end cap 140 in that it provides the vanes and target to center and hold the free end of spindle 170 once spindle 170 is inserted into tube 150. The loading of tube 150 is therefore otherwise very similar to the loading of tube 130 discussed above. Once loaded, there is one additional feature for the second embodiment shown in FIG. 14. That is air tight fitting 159 in end cap 158 that is provided to evacuate the interior of tube 150 when both end caps are in place, and to perhaps charge the interior of tube 150 with an inert gas, perhaps nitrogen. This could similarly be done with tube 130.

FIG. 22 shows, in a simplified perspective view, either at the end of the manufacturing process or as the initial step in the final assembly process, disks 9 in several gondolas 1 located one behind the other on rails 2. In all of the discussions above a single spindle 110 or 170 was assumed, however, it is possible to either lengthen the spindle or to connect two or more spindles together as shown here. This is practical in situations where the combined length of the connected spindles is not so long as to make the shipping tubes overly long and perhaps result in failure of the spindle in the center during transit since they are only supported at the two ends. To connect two spindles 110 together one could use a hex shaft 114 that is long enough to extend through both spindle sections. Similarly, two sections of spindle 170 can be connected together with a flat bar 168 that is long enough to extend through both sections. The detail of flat bar 168 in the space between two sections of spindle 170 is shown in FIG. 20 and is discussed further below.

Here there is also shown a double length spindle 110, 172 or 172' that is attached to a supporting end cap (not shown) of the shipping container in alignment with the center holes 138 in disks 9. Here the free end of the spindle is either aligned to be passed through the aligned center holes 138 to capture disks 9, or the spindle has recently been removed after having lowered disks 9 to awaiting gondolas 1. For purposes of the following discussion, it is necessary to note that while gondolas 1 are shown here as having a space between them, they in all probability will be immediately adjacent to each other. In either case, there will be a space between the two sets of disks 9 in adjacent gondolas of at lease twice the thickness of the ends of gondolas 1.

In FIGS. 18 and 19, a double length spindle 170 is shown in a simplified form to illustrate the loading of spindle 170 with disks 9 from gondolas 1 as in FIGS. 17a and 17b. FIG. 17a illustrates spindle 170 in place but not expanded, whereas in FIG. 17b spindle 170 is in place and has been expanded. FIG. 18 also illustrates spindle 170 in the not expanded configuration with end cap 158 with a wedge 172 attached thereto in position to be inserted into one end of spindle 170 when spindle 170 is expanded. FIG. 19, on the other hand, shows the expansion of spindle 170 with wedge 172 being inserted into vacant space 171 as lifting bar 168 (not shown) is lifted to lock disks 9 to spindle 170. At the distal end of spindle 170, as per this view, a flush wedge 172 is inserted into vacant space 171 and which would then be fully contained in tube 150 once loaded spindle 170 has been inserted as described previously with respect to spindle 130.

Also note in FIGS. 18 and 19 that spindle 170 is shown having two ganged sections. This is to illustrate the capability of loading disks from more that one gondola onto a single spindle with the break allowing for the thickness of both gondola ends. In such a situation it might be necessary to include another, or alternative, lifting point at which to raise bar 168 in the space between ganged sections of spindle 170, as shown in FIG. 20. Alternatively, since only a small force is needed to lift lifting bar 168, enough to raise "U" shaped piece 164 to capture disks 9, a single lifting point in the center of spindle 170 (see FIG. 20) could be used with the wedges 172 being inserted into the vacant space 171 at each end of spindle 170 as described above before spindle 170, with disks 9 attached, is lifted up and away from gondolas 1 with end cap 158 and taken to shipping tube 150.

FIGS. 21 and 22 are perspective views, similar to those of FIGS. 18 and 19, showing a cam actuated spindle 170'. Here there is shown three identical plastic pieces 174 each with a grooved bridge 166' to capture disks 9 when the cam action is activated. FIG. 21 shows spindle 171' in the relaxed configuration in preparation for insertion through center holes 138 of disks 9 in the gondola. At the proximate end of spindle 170' the interior thereof can be seen. Here the inner surface of plastic pieces 174 form an "S" shaped cam surface 176 with cam actuator lobes 176 intermediate cam surfaces 176. In turn, cam actuator lobes 178 are attached to shaft 180 which in turn is attached to the inner surface of end cap 158'. Plastic pieces 174 are retained in place by elastic rings 182 at both ends and in the center of spindle 170' in this view. Further, each of plastic pieces 174 provide approximately ⅓ of the circumference of spindle 170' with grooved bridges 166' being approximately 120° apart from each other.

Then in FIG. 22, the distal end of spindle 170' is shown in a holding fixture 184 with the cam action being initiated by rotating end cap 158' clockwise resulting in cam actuator lobes 178 pressing on cam surfaces 176 forcing grooved bridges 166' to expand outward in the directions of the three arrows to contact three different points of center hole 138 of disks 9.

The loading of spindle 170' is also similar to that if spindles 110 and 170.

While three rather specific embodiments have been shown and discussed of a spindle mounting and shipping system for magnetic disks, these three embodiments are merely representative of the many forms that various aspects of the system could take. Therefore it is to be understood that the present invention is not limited to these specific embodiments, but rather the present invention is only to be interpreted and limited by the scope of the following claims and equivalents thereof.

What is claimed is:

1. A shipping system for hard magnetic disks each having a first diameter and forming a central hole of a second diameter therethrough, said shipping system comprising:

an expandable spindle having a first length with said spindle expanding outwardly longitudinally along a portion of said first length with said disks disposed to be mounted and captured spaced apart from each other on said portion of said first length, and said spindle having a first and second end; and a shipping container comprising:

a longitudinally elongated shipping tube that has a longitudinal second length that is at least as long as said first length of said spindle and defining first and second openings at each end of said shipping tube perpendicular to a longitudinal axis of said shipping tube with each opening and interior of said tube having a minimum dimension that is larger than said first selected diameter of said disks, and having a closure device formed at said first and second openings;

a first end cap defining a complementary closure device thereon to mate with said closure device on said second opening of said shipping tube, and a central target on an inner surface of said first end cap to receive said second end of said spindle when said first end cap is secured to said second opening of said shipping tube and said spindle is inserted into said shipping tube; and a second end cap defining a complementary closure device thereon to mate with said closure device at a first opening of said shipping tube, and a device to capture said first end of said spindle on an interior surface to support said spindle cantilever fashion as said spindle loaded with said disks is inserted into said shipping tube, advanced toward said first end cap, and to support said first end of said spindle within said shipping tube when said second end cap makes closure with said first opening of said shipping tube.

2. A shipping system for hard magnetic disks as in claim 1 wherein said shipping tube and said first and second end caps are made of the same material.

3. A shipping system for hard magnetic disks as in claim 1 wherein said first and second openings are circular having a third diameter that is larger than said second diameter of said magnetic disks.

4. A shipping system for hard magnetic disks as in claim 1 wherein said shipping tube is formed with an exterior shape to facilitate stacking of said shipping tubes one on top of the other.

5. A shipping system for hard magnetic disks as in claim 4 wherein said exterior shape of said shipping tube includes:

a pair of shaped indentations spaced apart from each other less than a minimum dimension of said first and second openings of said shipping tube; and a pair of protrusions sized and shaped to mate with said pair of indentations located 180° around said shipping tube from said pair of indentations;

said pair of protrusions on one shipping tube mating with said indentations on a second shipping tube when said second shipping tube is stacked with said first shipping tube.

6. A shipping tube for hard magnetic disks as in claim 5 wherein each of said protrusions and indentations are semi-circular having a same fourth diameter.

7. A shipping system for hard magnetic disks as in claim 4 wherein said exterior shape of said shipping tube includes:

four outwardly protruding lobes with spacing between adjacent ones of said four lobes alternating between $\theta_1$ degrees and $\theta_2$ degrees where $\theta_1$ is greater than $\theta_2$;

with an inner surface of said lobes spaced $\theta_1$ degrees apart on one shipping tube mating with an outer surface of said lobes spaced $\theta_2$ degrees on a second shipping tube when said second shipping tube is stacked with said first shipping tube.

8. A shipping system for hard magnetic disks as in claim 7 wherein $\theta_1$ is 110 degrees and $\theta_2$ is 80 degrees.

9. A shipping system for hard magnetic disks as in claim 1 wherein:

said closure device formed at said first and second openings of said shipping tube are external screw threads; and said complementary closure device defined by said firs and second end caps are internal screw threads.

10. A shipping system for hard magnetic disks as in claim 1 wherein:

said closure device formed at said first and second openings of said shipping tube are notches in a plane perpendicular to a longitudinal axis of said shipping tube; and said complementary closure device defined by said first and second end caps are locking tabs shaped and disposed to pass through said notches of said shipping tube and to lock therewith.

11. A shipping system for hard magnetic disks as in claim 1 further including an air tight fitting in one of said shipping tube, said first end cap and second end cap to evacuate said shipping tube when said first and second end caps are in place at either end.

12. A shipping system for hard magnetic disks as in claim 11 wherein said air tight fitting can be used to charge said shipping tube with said first and second end caps affixed thereto with an inert gas.

13. A shipping system for hard magnetic disks as in claim 1 wherein said expandable spindle comprises:

an elongated double cam bar defining a first and a second cam 180° apart from each other along a substantially portion of said first length of said spindle with semi-circular end pieces extending outward at each end of double cam bar away from said first and second cams;

a pair of capture bridges, each defining an outwardly grooved section that is substantially as long as said first and second cams with each groove sized to accommodate a thickness of said magnetic disk within said central hole and to maintain said magnetic hard disks substantially parallel to each other when mounted on said spindle, and a semicircular end piece at each end of said capture bridge that defines a semicircular outer surface, as well as an arc of a semicircle to mate with the semicircular outer surface of said end pieces of said double cam bar, said end pieces of said capture bridge joining each end of said capture bridge with a shoulder beneath said grooved section; and a pair of elastic retainers encircling said end pieces of said capture bridges with said end pieces of each of said capture bridges being in contact with said end pieces of said double cam bar with said capture bridges aligned with each other and located 108° around said double cam bar from each other with said first and second cams located beneath and in contact with said capture bridges;

when said spindle has a relaxed orientation high points of said first and second cams extend outward between lower edges of said outwardly grooved section of each of said capture bridges, and when said spindle has an extended orientation high points of said first and second cams are in contact with the under side of said outwardly grooved section of each of said capture bridges.

14. A shipping system for hard magnetic disks as in claim 13 wherein:

each end portion of said elongated double cam bar, set back from each end of said end pieces, defines a location ridge; and said should near each of each of said capture bridges is disposed to align with said location ridges of said elongated double cam bar.

15. A shipping system for hard magnetic disks as in claim 13 wherein both end pieces of each of said capture bridges defines radial grooves with each said groove disposed to receive one of said pair of elastic retainers.

16. A shipping system for hard magnetic disks as in claim 1 wherein said expandable spindle comprises:

a flexible piece substantially as long as said first length of said spindle having a groove running the full length of one side thereof with a parallel repetition of two fingers extending outward at approximately 120° with respect to each other with each pair of fingers each spaced apart from a next two finger set;

a substantially "U" shaped piece substantially as long as said first length of said spindle having a bead along the entire length of one side thereof to mate with said groove in said one side of said flexible piece and a substantially "U" shaped notch in a side opposite said one side;

a "U" shaped plastic piece substantially as long as said first length of said spindle having a rounded first edge defining a plurality of grooves along the full length thereof with said grooves spaced apart from each other and having an open side, said "U" shaped plastic piece disposed to be inserted into said "U" shaped notch in said substantially "U" shaped piece with said rounded first edge adjacent said opposite side of said substantially "U" shaped piece and said open side of said "U" shape plastic piece disposed into said "U" shaped notch of said substantially "U" shaped piece; and a flat bar at least as long as said first length of said spindle with said flat bar sized and shaped to fit within said "U" shaped plastic piece;

with said flat bar being disposed to be lifted to raise said rounded first edge of said "U" shaped plastic piece to lock said central hole of each of said disks mounted on said spindle between said first rounded edge and consecutive pairs of said two fingers of said flexible piece when said spindle is fully assembled and said spindle has been inserted through said central holes of said disks.

17. A shipping system for hard magnetic disks as in claim 16 wherein said grooves in said first edge of said "U" shaped plastic piece are disposed to be substantially aligned with said spaces between each pair of fingers of said flexible piece when said spindle is fully assembled.

18. A shipping system for hard magnetic disks as in claim 16 wherein each of said pair of fingers of said flexible piece is spaced apart, and parallel to, the nearest other two fingers by a distance substantially equal to, or slightly less than, the thickness of said disks, thus, the spacing between disks when loaded on said spindle is substantially equal to the thickness of each pair of fingers.

19. A shipping system for hard magnetic disks as in claim 16 wherein said grooves in said first edge of said "U" shaped plastic piece are spaced apart a distance that is substantially equal to the thickness of each of said two fingers of said flexible piece and said grooves have a width that is substantially equal to, or less than, the thickness of said disk.

20. A shipping system for hard magnetic disks as in claim 16 wherein:

said second end cap defines an inwardly directed wedge disposed to be inserted into a vacant space in said "U" shaped notch of said substantially "U" shaped piece beneath said flat bar and said "U" shaped plastic piece of said first end of said expandable spindle, said vacant space being created when said flat bar is lifted; and said shipping system further includes a free wedge disposed to be inserted into said vacant space at said second end of said expandable spindle when said flat bar is lifted, said free wedge being flush with said second end of said spindle when inserted;

said wedges being used to maintain said spindle in an expanded configuration to retain disks captured by said first edge of said "U" shaped plastic piece and said fingers of said flexible piece.

21. A shipping system for hard magnetic disks as in claim 1 wherein:

said expandable spindle comprises:

three identical plastic pieces, each having a length that is substantially equal to said first length and forming one-third of the circumference of said spindle, each of said plastic pieces includes an outwardly oriented grooved bridge running the full length thereof with an "S" shaped cam surface that is inwardly oriented; and elastic retainer rings, one at each end of said three identical pieces to hold said spindle pieces together; and said second end cap comprises:

an inwardly directed centrally located shaft; and three cam actuators at a distal end of said shaft spaced evenly from each other with one of said cam actuators disposed to contact said "S" shaped cam surface of a different one of said three identical plastic pieces;

the expansion of said spindle being controlled by rotation of said second end cap relative to said spindle with each of said cam actuators pressing outward against said "S" shaped cam surfaces in opposition to said elastic retainer rings thus causing said grooved bridges to move outward from a static position to contact three different points within said central hole of said disks when mounted on said spindle.

22. An expandable spindle on which to securely mount hard magnetic disks during transit, said expandable spindle comprising:

an elongated double cam bar defining a first and a second cam 180° apart from each other along a substantially portion of a length of said spindle with semicircular end pieces extending outward at each end of double cam bar away from said first and second cams;

a pair of capture bridges, each defining an outwardly grooved section that is substantially as long as said first and second cams with each groove sized to accommodate a thickness of said hard magnetic disk within said central hole and to maintain said magnetic hard disks substantially parallel to each other when mounted on said spindle, and a semicircular end piece at each end of said capture bridge that defines a semicircular outer surface, as well as an arc of a semicircle to mate with the semicircular outer surface of said end pieces of said double cam bar, said end pieces of said capture bridge joining each end of said capture bridge with a shoulder beneath said grooved section; and a pair of elastic retainers encircling said end pieces of said capture bridges with said end pieces of each of said capture bridges being in contact with said end pieces of said double cam bar with said capture bridges aligned with each other and located 180° around said double cam bar from each other with said first and second cams located beneath and in contact with said capture bridges;

when said spindle has a relaxed orientation, high points of said first and second cams extend outward between lower edges of said outwardly grooved section of each of said capture bridges, and when said spindle has an extended orientation, high points of said first and second cams are in contact with the under side of said outwardly grooved section of each of said capture bridges.

23. An expandable spindle as in claim 22 wherein:

each end portion of said elongated double cam bar, set back from each end of said end pieces, defines a location ridge; and said shoulder near each of each of said said capture bridges is disposed to align with said location ridges of said elongated double cam bar.

24. An expandable spindle as in claim 22 wherein both end pieces of each of said capture bridges defines radial grooves with each said groove disposed to receive one of said pair of elastic retainers.

25. An expandable spindle on which to securely mount hard magnetic disks during transit, said expandable spindle comprising:

a flexible piece substantially as long as said spindle having a groove running the full length of one side thereof with a parallel repetition of two fingers extending outward at approximately 120° with respect to each other with each pair of fingers each spaced apart from a next two finger set;

a substantially "U" shaped piece substantially as long as said spindle having a bead along the entire length of one side thereof to mate with said groove in said one side of said flexible piece and a substantially "U" shaped notch in a side opposite said one side;

a "U" shaped plastic piece substantially as long as said spindle having a rounded first edge defining a plurality of grooves along the full length thereof with said grooves spaced apart from each other and having an open side, said "U" shaped plastic piece disposed to be inserted into said "U" shaped notch in said substantially "U" shaped piece with said rounded first edge adjacent said opposite side of said substantially "U" shaped piece and said open side of said "U" shape plastic piece disposed into said "U" shaped notch of said substantially "U" shaped piece; and a flat bar at least as long as said first length of said spindle with said flat bar sized and shaped to fit within said "U" shaped plastic piece;

with said flat bar being disposed to be lifted to raise said rounded first edge of said "U" shaped plastic piece to lock said central hole of each of said disks mounted on said spindle between said first rounded edge and consecutive pairs of said two fingers of said flexible piece when said spindle is fully assembled and said spindle has been inserted through said central holes of said disks.

26. An expandable spindle as in claim 25 wherein said grooves in said first edge of said "U" shaped plastic piece are disposed to be substantially aligned with said spaces between each pair of fingers of said flexible piece when said spindle is fully assembled.

27. An expandable spindle claim 25 wherein each of said pair of fingers of said flexible piece is spaced apart, and parallel to, the nearest other two fingers by a distance substantially equal to, or slightly less than, the thickness of said disks, thus, the spacing between disks when loaded on said spindle is substantially equal to the thickness of each pair of fingers.

28. An expandable spindle as in claim 25 wherein said grooves in said first edge of said "U" shaped plastic piece are spaced apart a distance that is substantially equal to the thickness of each of said two fingers of said flexible piece and said grooves have a width that is substantially equal to, or less than, the thickness of said disk.

29. An expandable spindle on which to securely mount hard magnetic disks during transit, said expandable spindle comprising:

three identical plastic pieces, each having a length that is substantially equal to the length of said spindle and forming one-third of the circumference of said spindle, each of said plastic pieces includes an outwardly oriented grooved bridge running the full length thereof with an "S" shaped cam surface that is inwardly oriented; and elastic retainer rings, one at each end of said three identical pieces to hold said spindle pieces together;

said "S" shaped cam surfaces being disposed to interface with three cam actuators spaced evenly from each other with one of said cam actuators disposed to contact said "S" shaped cam surface of a different one of said three identical plastic pieces;

the expansion of said spindle being controlled by rotation of said cam actuators relative to said spindle with each of said cam actuators pressing outward against said "S" shaped cam surfaces in opposition to said elastic retainer rings thus causing said grooved bridges to move outward from a static position to contact three different points within said central hole of said disks when mounted on said spindle.

\* \* \* \* \*